(12) United States Patent
Ishii et al.

(10) Patent No.: US 6,468,895 B2
(45) Date of Patent: Oct. 22, 2002

(54) PATTERN FORMING METHOD

(75) Inventors: Hiromu Ishii; Shouji Yagi; Katsuyuki Machida; Kunio Saito; Tadao Nagatsuma, all of Kanagawa; Hakaru Kyuragi, Tokyo, all of (JP)

(73) Assignee: Nippon Telegraph and Telephone Corporation (JP)

( * ) Notice: Subject to any disclaimer, the term of this patent is extended or adjusted under 35 U.S.C. 154(b) by 0 days.

(21) Appl. No.: 09/826,029

(22) Filed: Apr. 3, 2001

(65) Prior Publication Data

US 2001/0027019 A1 Oct. 4, 2001

(30) Foreign Application Priority Data

Apr. 4, 2000 (JP) .......................... 2000/102290
Apr. 4, 2000 (JP) .......................... 2000/102296

(51) Int. Cl.$^7$ ........................................ H04L 21/4763
(52) U.S. Cl. ..................................... 438/633
(58) Field of Search ................. 438/687, 633, 438/637, 638, 643, 650, 666, 669, 672

(56) References Cited

U.S. PATENT DOCUMENTS 6,162,728 A * 12/2000 Tsao et al. ............... 438/687
6,245,676 B1 * 6/2001 Ueno ........................ 438/687

OTHER PUBLICATIONS

H. Ishii et al., "A New Fabrication Process for Low–loss Millimeter–Wave Transmission Lines on Silicon," Jpn. J.Appl. Phys. vol. 39 Part 1, No. 4B, pp. 1982–1986, Apr. 2000.

A. Krishnan et al., "Copper Metallization For VLSI Applications," Jun. 9–10, 1992 VMIC Conference.

* cited by examiner

*Primary Examiner*—David Nelms
*Assistant Examiner*—Quoc Hoang
(74) *Attorney, Agent, or Firm*—Blakely Sokoloff Taylor & Zafman (57) ABSTRACT

In a pattern forming method, a trench is formed on a flat base. A pattern material is arranged only in and around the trench so as to project upward from the surface of the base and to be larger than the opening of the trench. The pattern material projecting from the surface of the base is removed by chemical mechanical polishing (CMP) so as to be flush with the upper surface of the base.

4 Claims, 6 Drawing Sheets

PATTERN FORMING METHOD

BACKGROUND OF THE INVENTION

The present invention relates to a pattern forming method of forming a micropattern, e.g., a relatively thick interconnection with a film thickness of about 10 μm, which is used in a semiconductor device or micromachine device.

In a semiconductor device, to integrate elements within a small area with a higher degree of integration, elements and interconnections must be formed with smaller sizes, and a multilayered structure of interconnections must be used. In a micromachine device as well, a multilayered structure is used to realize a three-dimensional structure. In these multilayered structures, all the layers are not uniform-thick flat layers, but some layers have complicated three-dimensional shapes with various patterns. For example, in an LSI, a plurality of elements formed on a silicon substrate are connected to each other with a plurality of interconnection layers formed in a multilayered structure on the elements, thereby forming a circuit. In such a multilayered interconnection structure, the three-dimensional shape of the interconnection layer is absorbed by an interlayer dielectric film to obtain a flat state, and another interconnection layer is formed on it.

Among techniques of forming flat an interlayer dielectric film and the like on a three-dimensional shape, according to one technique, an interlayer dielectric film is formed on a three-dimensional shape, and after that the projecting portions of the surface of the interlayer dielectric film in which the three-dimensional shape is reflected is selectively removed, thereby planarizing the interlayer dielectric film. According to another technique called damascene, a trench is formed in a flat interlayer dielectric film, and a material for forming a pattern such as an interconnection fills the trench to form a pattern layer such as an interconnection layer. When the interconnection layer is formed, it is already flat. In damascene, chemical mechanical polishing (CMP) is often used in order to achieve a state wherein an interconnection electrode fills a trench.

Figure 3A:
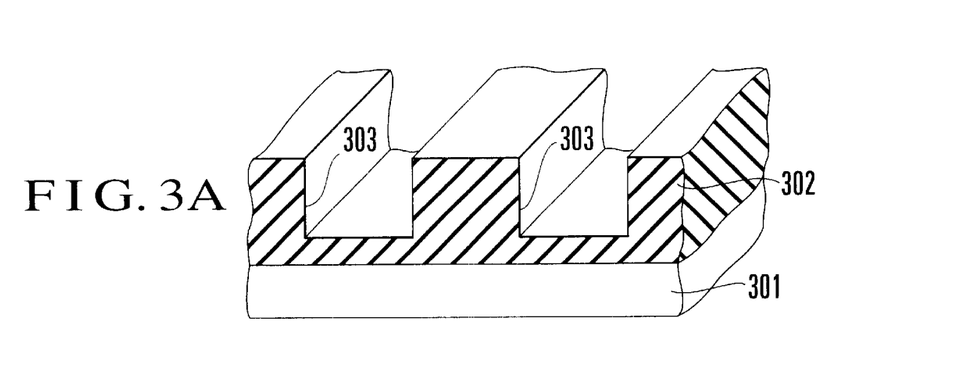
FIGS. 3A to 3D are views showing the manufacturing steps to explain a conventional pattern forming method.

Formation of a multilayered interconnection structure according to damascene will be briefly described. As shown in FIG. 3A, an insulating film 302 is formed on a substrate 301, and trenches 303 are formed at predetermined portions of the insulating film 302 so as not to extend through the insulating film 302.

Figure 3B:
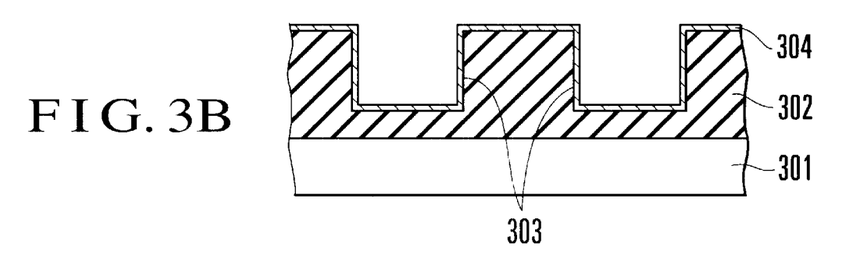
Figure 3C:
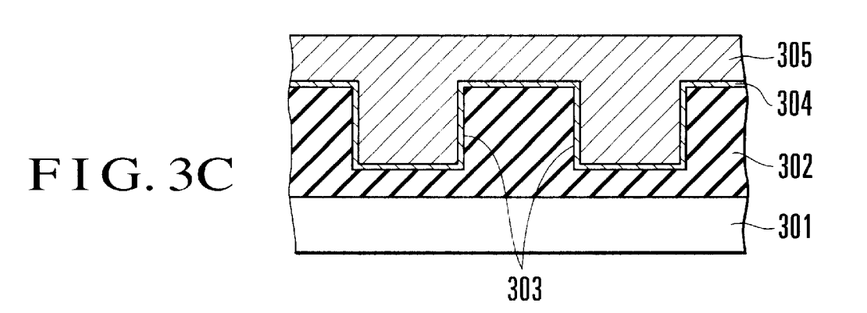

As shown in FIG. 3B, a plating seed layer 304 is formed on the surface of the insulating film 302 including the interiors of the trenches 303. After that, as shown in FIG. 3C, the surface of the insulating film 302 including the interiors of the trenches 303 is plated, thereby forming an interconnection metal film 305 through the seed layer 304.

Figure 3D:
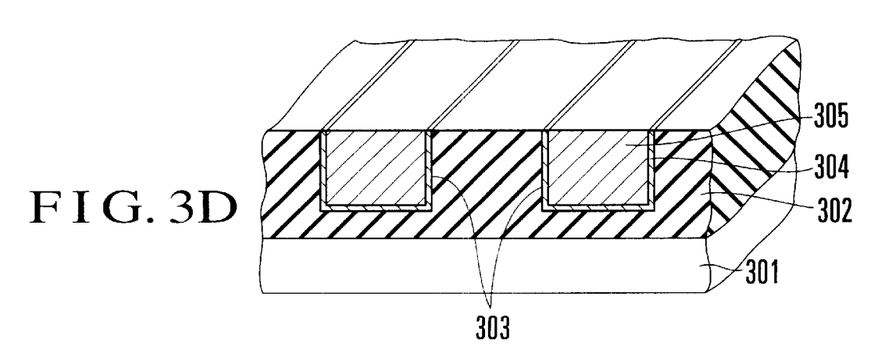

Finally, as shown in FIG. 3D, the interconnection metal film 305 is polished by CMP until the surface of the insulating film 302 is exposed, while leaving the interconnection metal film 305 only in the trenches 303, thereby forming interconnection layers 306. In CMP, if the metal film is selectively polished with respect to the insulating film, polishing can be stopped when the surface of the insulating film 302 is exposed. In damascene, when the interconnection layers are formed, the surfaces of the interconnection layers and the upper surface of the insulating film have been planarized and flush with each other. Therefore, the surface of the insulating film need not be planarized. In formation of a multilayered interconnection structure in accordance with damascene, "formation of an insulating film—formation of trenches—formation of interconnection layers" is repeated a predetermined number of times.

Figure 4A:
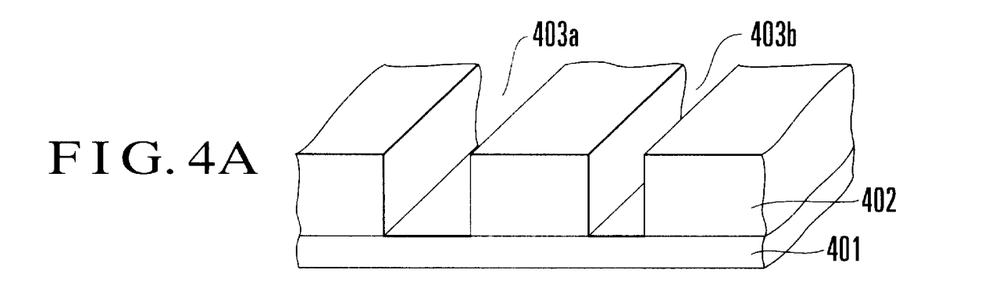
FIGS. 4A to 4C are views showing the manufacturing steps to explain another conventional pattern forming method.

Another conventionally known method will be described. As shown in FIG. 4A, an interlayer film 402 is formed on a substrate 401, and trenches 403a and 403b with predetermined shapes are formed at predetermined portions of the interlayer film 402.

Figure 4B:
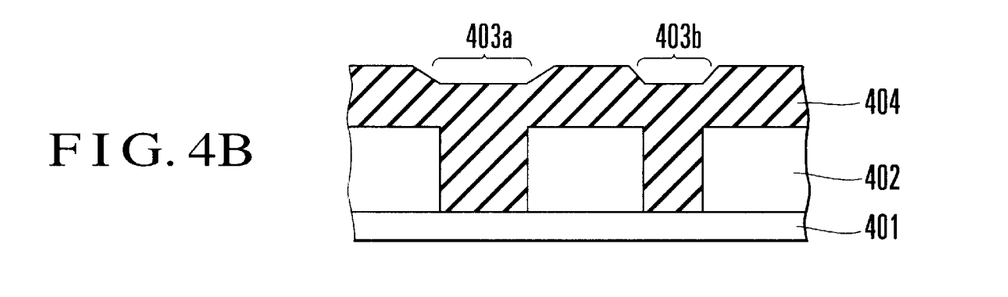

As shown in FIG. 4B, a polyimide resin film 404 is formed on the interlayer film 402 including the interiors of the trenches 403a and 403b, so the trenches 403a and 403b are filled with polyimide resin.

Figure 4C:
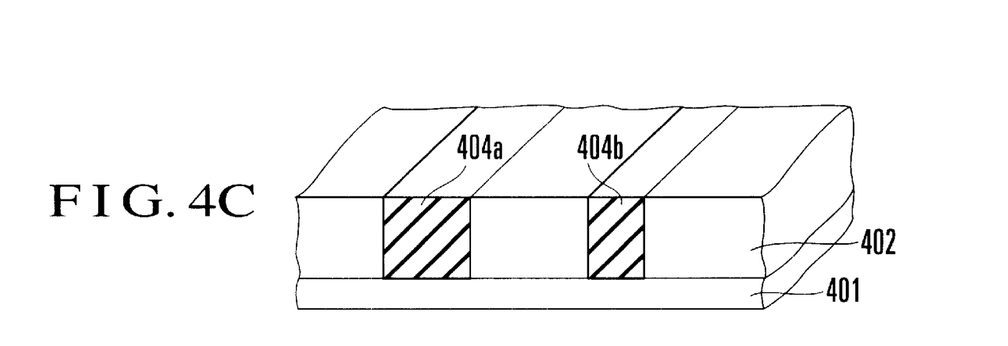

Finally, as shown in FIG. 4C, the polyimide resin film 404 is polished by CMP until the surface of the interlayer film 402 is exposed, while leaving the polyimide resin only in the trenches 403a and 403b, thereby forming patterns 404a and 404b. In CMP, if the polyimide resin is selectively polished with respect to the material of the interlayer film 402, polishing can be stopped when the surface of the interlayer film 402 is exposed.

CMP used in damascene described above is a very effective means if a sufficiently high polishing selectivity can be maintained between a film to be polished and a film not to be polished. Even if a sufficiently high polishing selectivity cannot be maintained, when the film not to be polished is as thin as about 1 μm, CMP is still effective as a planarizing means.

When a polishing target for CMP is a thick film with a thickness of about 10 μm as in formation of a micromachine, it is very difficult to determine the end of polishing, and the polishing rate must be inevitably reduced, leading to an increase in polishing time.

When the film thickness increases to as large as 10 μm, variations in thickness increase. When this film is polished by CMP, even if polishing is ended at a certain region, a film to be polished still remains at another region, making it very difficult to determine the end point. For this reason, conventionally, coarse polishing is performed first, and then finish polishing is performed by decreasing the polishing rate very low so the polishing selectivity is increased. In this manner, when a film with a thickness of about 10 μm is to be planarized by polishing in accordance with CMP, it conventionally takes a very long time, for example, to form a micromachine by using damascene.

SUMMARY OF THE INVENTION

It is a principal object of the present invention to provide a pattern forming method which can planarize a comparatively thick film with a thickness of about 10 μm within a shorter period of time than in the prior art.

In order to achieve the above object, according to the basic idea of the present invention, a portion to be polished by CMP is made present only near a desired pattern.

According to the present invention, there is provided a pattern forming method comprising the steps of forming a recess in a flat base, arranging a pattern material only in and around the recess so as to project upward from a surface of the base and to be larger than an opening of the recess, and removing the pattern material projecting from the surface of the base by chemical mechanical polishing (CMP) so as to be flush with an upper surface of the base.

DESCRIPTION OF THE PREFERRED EMBODIMENTS

The present invention will be described by way of its preferred embodiments.

First Embodiment

Figure 1A:
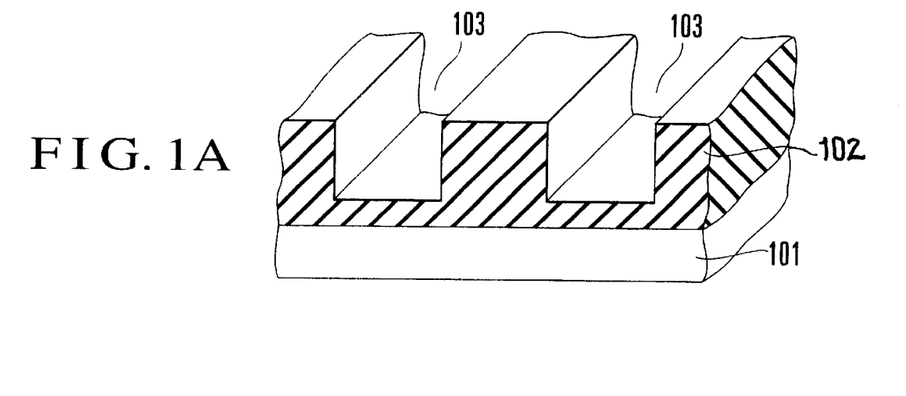
FIGS. 1A to 1F are views showing the manufacturing steps to explain a pattern forming method according to an embodiment of the present invention.

As shown in FIG. 1A, an interlayer dielectric film 102 is formed on a silicon substrate 101 to a thickness of about 2 μm. Trenches 103 are formed in the interlayer dielectric film 102 to a depth of about 1 μn in accordance with a predetermined pattern. The interlayer dielectric film 102 may be formed by depositing a silicon oxide by CVD (Chemical Vapor Deposition). For example, a silicon oxide film is deposited on the substrate 101 by plasma CVD using monosilane ($SiH_4$) gas and oxygen gas as the source gases and setting the substrate temperature to about 400° C., thereby forming the interlayer dielectric film 102.

The trenches 103 may be formed by the known photolithography technique and etching technique. For example, a resist pattern with opening for trench forming portions is formed on the interlayer dielectric film 102 by the photolithography technique. After that, the interlayer dielectric film 102 is selectively etched a predetermined amount by dry etching using, as a mask, the resist pattern formed by the plasma of a gas mixture of oxygen and $CF_4$, thereby forming the trenches 103. In this case, the trenches 103 are set to have an appropriate depth so as not to extend through the interlayer dielectric film 102.

Figure 1B:
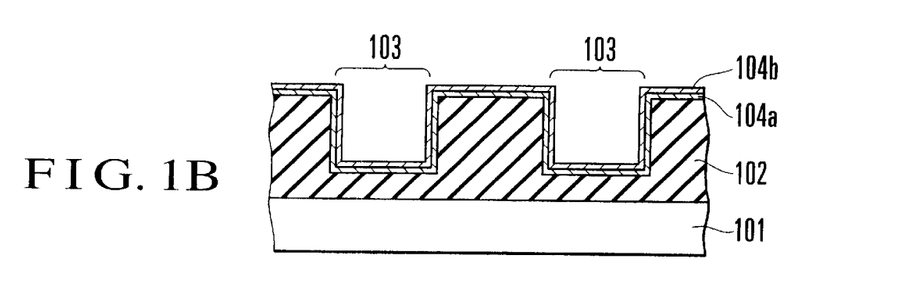

As shown in FIG. 1B, a 0.1-μm thick barrier film 104a made of titanium nitride is formed on the exposed surface of the interlayer dielectric film 102 including the two side surfaces and bottom of each trench 103. Then, a 0.1-μm thick seed layer 104b made of copper is formed on the surface of the barrier film 104a. The titanium nitride film 104a and copper film 104b used in this case can be formed by known sputtering vapor deposition. The barrier film 104a is formed to improve the adhesion properties between the interconnection material and the interlayer dielectric film and to suppress diffusion of the interconnection material into the interlayer dielectric film. Although titanium nitride is used in this embodiment to form the barrier film 104a, another material may be used if it serves as a barrier and has adhesion properties. Although the barrier film is made of one material in this embodiment, it may be a film with a two-layered structure consisting of a titanium nitride film and titanium layer, or a multilayered structure.

Figure 1C:
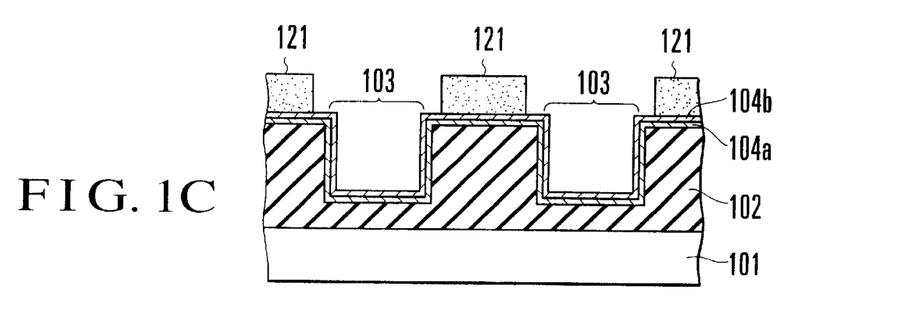

As shown in FIG. 1C, a resist pattern layer 121 with openings for a region which is slightly larger than a formation region of the trenches 103 and includes the formation region of the trenches 103 is formed on the exposed surface of the interlayer dielectric film 102. The resist pattern layer 121 may be formed by the photolithography technique using a positive photoresist. More specifically, a positive photoresist is formed to a predetermined thickness, and after that, the region slightly larger than the formation region of the trenches 103 is selectively irradiated with light (ultraviolet rays) centered on the formation region of the trenches 103. Then, the irradiated region is developed with an alkaline solution, thereby forming resist patterns 121.

As shown in FIG. 1C, the opening regions of the resist patterns 121 are set larger than the widths of the corresponding trenches 103. In this case, since the barrier film 104a and seed layer 104b are formed on the surface of the interlayer dielectric film 102, the resist patterns 121 are formed on the interlayer dielectric film 102 through the barrier film 104a and seed layer 104b, and the barrier film 104a and seed layer 104b exist between the interlayer dielectric film 102 and resist patterns 121.

Figure 1D:
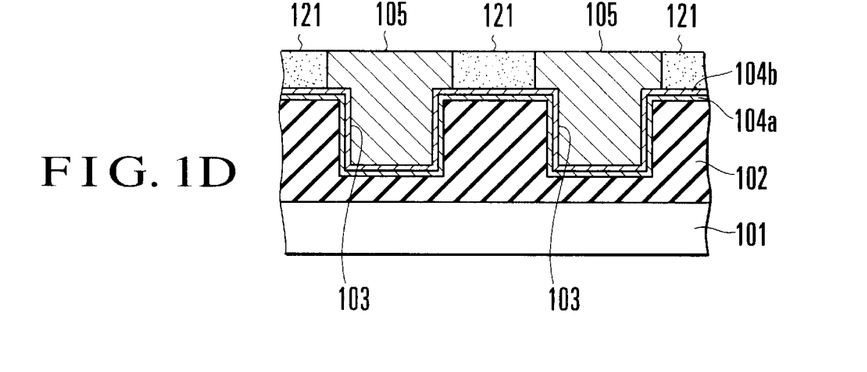

By electroplating using the seed layer 104b as one electrode, a copper film is selectively formed to a thickness of about 15 μm on only those portions of the opening regions of the resist patterns 121 where the seed layer 104b is exposed, thereby forming metal patterns (first metal patterns) 105 that fill the trenches 103 and the opening regions of the resist patterns 121. The metal patterns 105 are not be limited to copper patterns, but may be formed of gold, silver, or nickel.

Figure 1E:
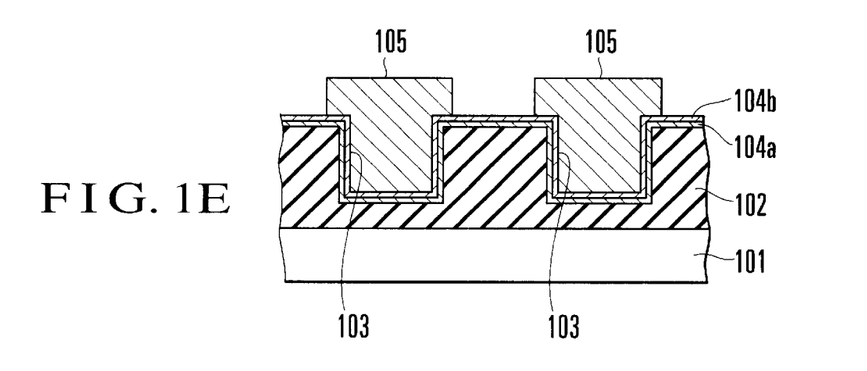
Figure 1F:
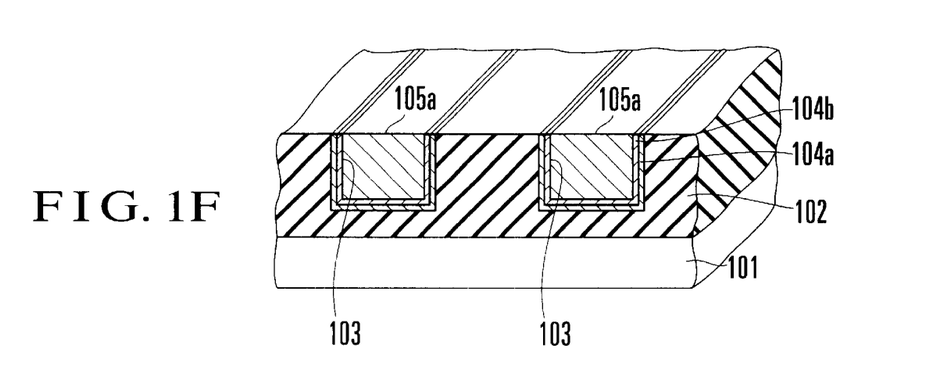

As shown in FIG. 1E, only the resist patterns 121 are removed, and those portions of the metal patterns 105 which project upward from the surface of the interlayer dielectric film 102 are polished by chemical mechanical polishing (CMP), thereby planarizing the interlayer dielectric film 102. As a result, as shown in FIG. 1E, interconnection patterns (second metal patterns) 105a made of copper are formed in the recesses 103 of the interlayer dielectric film 102 through the barrier film 104a and seed layer 104b. The interconnection patterns 105a are formed in the trenches 103 to be flush with the interlayer dielectric film 102.

This planarization polishing using CMP employs a slurry comprised of alumina and an aqueous solution of hydrogen peroxide. This CMP can polish those portions of the metal patterns 105, which project upward from the interlayer dielectric film 102, and the barrier film 104a and seed layer 104b formed on those surfaces of the regions of the interlayer dielectric film 102 except the portions in the trenches 103. The polishing end point may be set to a time point when it can be visually confirmed that the surface of the interlayer dielectric film 102 except the portions in the trenches 103 is exposed. CMP connot greatly polish an inorganic insulating material. Hence, once the surface of the interlayer dielectric film 102 is exposed, progress of polishing becomes very slow, and the end point can be detected easily.

Unlike this embodiment, if CMP for planarization is to be performed in the conventional manner without forming the metal patterns 105 but with a metal film being formed on the entire region of the interlayer dielectric film, first, coarse polishing is performed for 15 minutes, and then finish polishing is performed. As described above, when the metal film is thick, variations in film thickness are large. Hence, when the polishing end point comes near, a region where the metal film still remains thick and a region where substantially no metal film remains coexist. In finish polishing, the variations in film thickness and the polishing selectivity not only between the metal film and insulating film but also between the barrier film and metal film must be considered, and accordingly finish polishing is performed at a very low polishing rate. Consequently, finish polishing takes about 300 minutes.

When compared to the above prior art technique, according to this embodiment, the time necessary for grinding/polishing by CMP can be shortened to about ⅕ or less.

In this embodiment, the polishing target for CMP has a projecting shape. Accordingly, the polishing amount (polishing area) as a whole is smaller than that in the prior art, and the polishing target can be polished easily because of its shape. It is supposed that these facts enable quick planarization polishing of about 22 min.

The above description shows a comparison in process time between the present invention which aims at polishing a projection and the combination of conventional coarse polishing and finish polishing. According to CMP, generally, a polishing rate R is proportional to the product of a pressure P applied to the polishing surface and a relative velocity V between the polishing pad and the polishing target surface. In other words, $R = k \times P \times V$ where k is a proportional constant, which is a function of chemical conditions such as a slurry. To form a projection and then polish it is to decrease the polishing area, thereby increasing the pressure applied to the polishing target surface. This increases the polishing rate.

Therefore, even when the metal patterns 105 are made of either one of gold, copper, silver, aluminum tungsten, titanium, platinum, nickel, chromium, and molybdenum which are conductive materials, or an alloy of some of these metals, or a silicide of either one of these metals, if projections are formed similarly, the same operation and effect as those of the above embodiment can be obtained. When patterns using one of these conductive materials are to be formed, the barrier film 104a may be formed on the surface of the interlayer dielectric film 102 including the interiors of the recesses 103, and after that the resist patterns 121 may be formed. The conductive material may be filled in the opening region of the resist patterns 121 by generally known vapor deposition, sputtering, or the like, and after that steps identical to those of the above embodiment may be performed. Actually, the polishing rate of a case wherein the entire copper surface was polished and that of a case wherein copper projections were polished were compared while using as a slurry one obtained by mixing alumina with a particle size of 0.3 $\mu$m, pure water, and an aqueous solution of hydrogen peroxide with ratio of 1:1. The polishing rate of the former case was 0.15 $\mu$n/min, whereas that of the latter case was 1.5 $\mu$m/min, thus enabling high-rate polishing.

According to this embodiment, since the polishing end point can be detected easily and a high polishing selectivity between the metal or barrier film as the polishing target and the interlayer dielectric film can be sufficiently maintained easily, the polishing target can be planarized highly uniformly. In this embodiment, since the polishing area is small, the polishing rate increases. Polishing thus progresses fast even under conventional conditions with which the polishing rate is decreased. Therefore, according to this embodiment, even if the conditions are such that the polishing rate will decrease so the polishing selectivity among different materials is improved, the actual polishing rate does not decrease. As a result, as described above, the polishing target can be planarized highly uniformly without sacrificing the actual polishing rate and while sufficiently maintaining a high polishing selectivity.

As described above, according to the first embodiment of the present invention, metal patterns partly exist on the surface of an interlayer dielectric film during the manufacture, and these partial metal patterns become the polishing target in CMP. The polishing amount (polishing area) is thus smaller than in the prior art, and the polishing target can be polished easily due to its shape. Therefore, in accordance with damascene which performs planarization by CMP, a semiconductor device or micromachine can be formed within a shorter period of time than in the prior art, which is an excellent effect.

Second Embodiment

Another embodiment will be described with reference to FIGS. 2A to 2E.

Figure 2A:
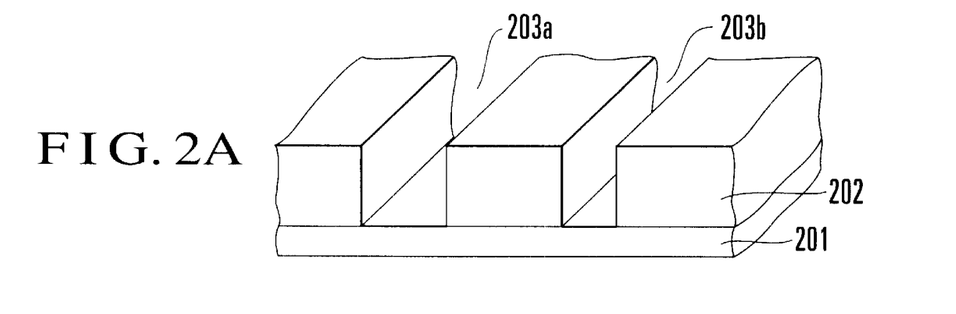
FIGS. 2A to 2E are views showing the manufacturing steps of another embodiment of the present invention.

As shown in FIG. 2A, an interlayer film (substrate) 202 is formed on a substrate 201 to a thickness of about 10 $\mu$m, and trenches 203a and 203b are formed at predetermined portions of the interlayer film 202 such that they extend through the interlayer film 202 to reach the substrate 201. The interlayer film 202 may be formed of, e.g., polysilicon. In this case, the surface of the interlayer film 202 is thermally oxidized to form a thermal oxide film to a thickness of about 1 $\mu$m, and a resist pattern is formed on the thermal oxide film by the photolithography technique. The thermal oxide film is wet-etched with an HF solution by using this resist pattern as a mask, thereby patterning the thermal oxide film.

Subsequently, the resist pattern is removed, and the interlayer film 202 is selectively removed by wet etching with an aqueous solution of potassium hydroxide by using the pattern of the thermal oxide film as a mask, thereby forming the trenches 203a and 203b.

Figure 2B:
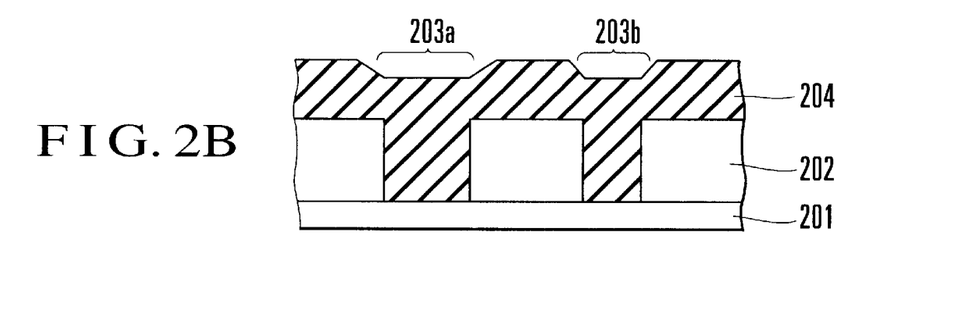

A resin film 204 made of photosensitive polyimide is formed on the interlayer film 202 with the trenches 203a and 203b to a thickness of about 16 $\mu$m. As the photosensitive polyimide, for example, one obtained by adding a positive photosensitive agent, e.g., CRC8300 manufactured by SUMITOMO BAKELITE CO., LTD., to a base resin such as polyimide may be used instead. Although polyimide is used as the base resin in this embodiment, the present invention is not limited to this, and polybenzoxazole with similar properties can be used. When CRC8300 described above is used as the photosensitive agent, first, the resin film is formed on the interlayer film 202 by spin coating. Then, prebaking (preheating) at about 120° C. is performed for 4 min by using a hot plate to remove an organic solvent component from the resin film by a certain degree.

Figure 2C:
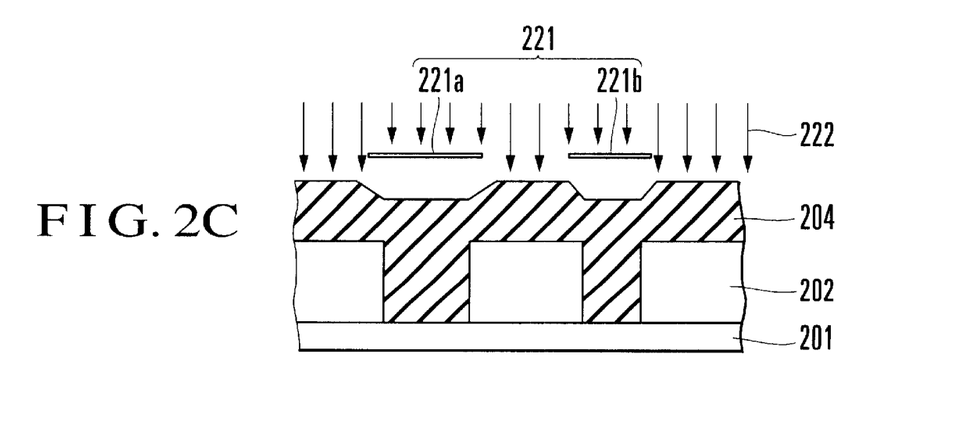

Using a photomask 221 with portions 221a and 221b that light-shield a region which is slightly larger than the formation region of the trenches 203a and 203b and centered on the formation region of the trenches 203a and 203b, that region of the resin film 204 which are not light-shielded by the photomask 221 is selectively irradiated with ultraviolet rays 222.

Figure 2D:
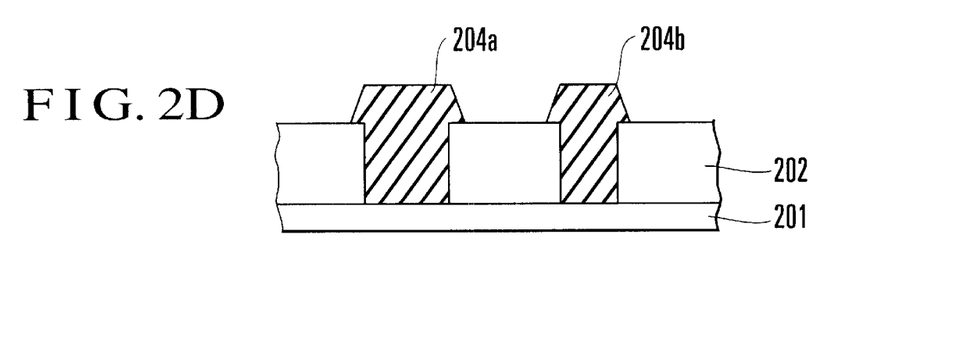

After that, development is performed by using a predetermined developing solution, and the resultant structure is heated in order to set the resin. Then, the photosensitive agent is removed, thereby forming projecting patterns (first patterns) 204a and 204b, as shown in FIG. 2D. To set the resin by heating as described above, the structure is held at 150° C. in a nitrogen gas atmosphere for about 30 min, and successively at 310° C. to 320° C. for about 30 min.

Figure 2E:
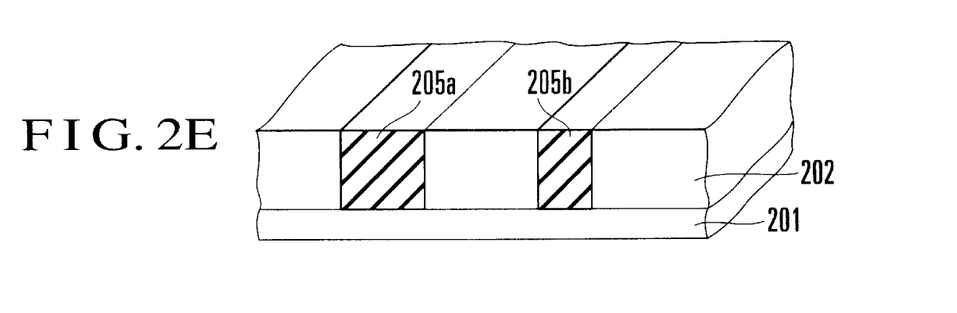

Those portions of the projecting patterns 204a and 204b, which project from the surface of the interlayer film 202, are polished by chemical mechanical polishing (CMP), thereby planarizing the interlayer film 202. As a result, as shown in FIG. 2E, predetermined patterns (second patterns) 205a and 205b made of polyimide are formed in the recesses 203a and 203b of the interlayer film 202. The patterns 205a and 205b are formed in the trenches 203a and 203b to be flush with the interlayer film 202.

After that, for example, a predetermined structure is formed on the interlayer film 202 including part of the region of the patterns 205a and 205b. After the structure is formed, it is dissolved in an organic solvent, thereby selectively removing only the patterns 205a and 205b made of a resin. Thus, a state wherein spaces formed of the trenches 203a and 203b are formed under the structure can be obtained. At this time, this structure can be formed easily and accurately since its underlying layer has been planarized.

In planarization polishing in accordance with CMP described above, a slurry made of alumina is used. With this CMP, the projecting portions of the patterns 205a and 205b above the interlayer film 202 can be polished within about 3 min. The polishing end point may be set to a time point when it can be visually confirmed that the surface of the interlayer dielectric film 202 except the portions in the trenches 203a and 203b is exposed. With this polishing by CMP, once the surface of the interlayer dielectric film 202 made of silicon is exposed, progress of polishing becomes very slow, and the end point can be detected easily.

Unlike the second embodiment, if CMP for planarization is to be performed in the conventional manner without forming the patterns 205a and 205b but with a resin film being formed on the entire region of the interlayer dielectric film, first, coarse polishing is performed for 25 min, and then finish polishing is performed. As described above, when the resin film is thick, variations in film thickness are large. Hence, when the polishing end point comes near, a region where the resin film still remains thick and a region where substantially no resin film remains coexist. In finish polishing, the variations in film thickness and the polishing selectivity between the resin film and the underlying insulating film must be considered, and accordingly finish polishing is performed with a very low polishing rate. Consequently, finish polishing takes about 55 min.

When compared to the above prior art technique, according to the second embodiment, the time necessary for polishing by CMP can be shortened to about 1/20 or less.

In the second embodiment, the polishing target for CMP has a projecting shape. Accordingly, the polishing amount (polishing area) is small, and the polishing target can be polished easily because of its shape. It is supposed that these facts enable quick planarization polishing of about 3 min.

According to the second embodiment, since the polishing end point can be detected easily and a high polishing selectivity between the resin film and interlayer film can be sufficiently maintained easily, the polishing target can be planarized highly uniformly. In this embodiment, since the polishing target is small and is polished three-dimensionally, the polishing rate increases. Polishing thus progresses fast even under conventional conditions with which the polishing rate is decreased. Therefore, according to this embodiment, even if the conditions are such that the polishing rate will decrease so the polishing selectivity among different materials is improved, the actual polishing rate does not decrease. As a result, as described above, the polishing target can be planarized highly uniformly without sacrificing the actual polishing rate and while sufficiently maintaining a high polishing selectivity.

As has been described above, according to the present invention, the first patterns partly exist on the surface of a substrate during the manufacture, and these partial first patterns become the polishing target in CMP. The polishing amount (polishing area) is thus small and the polishing target can be polished easily due to its shape. Therefore, in accordance with damascene which performs planarization by CMP, a pattern used in a micromachine or the like can be formed within a shorter period of time than in the prior art, which is an excellent effect.

What is claimed is:

1. A pattern forming method comprising at least the steps of:

forming a recess in a substrate;

forming a resin film made of an ultraviolet-photosensitive resin on the substrate to fill the recess;

selectively exposing the resin film such that solubility of the resin film with respect to a developing solution differs between a first region larger than the recess and centered on the recess and a region other than the first region;

after the step of exposing, developing the resin film with the developing solution to remove the region other than the first region, thereby forming a first pattern comprised of the first region of the resin film; and selectively polishing that portion of the first pattern, which projects from the substrate by chemical mechanical polishing (CMP), so that an interior of the recess is filled with a second pattern made of the resin so as to be flush with the substrate.

2. A method according to claim 1, wherein the resin essentially consists of polyimide.

3. A method according to claim 1, wherein the resin essentially consists of polybenzoxazole.

4. A method according to claim 1, wherein the recess is a trench extending on the substrate in a predetermined direction.

* * * * *